INVENTOR.
Tomomi Murakami
BY Eugene M. Whitacre
Attorney

July 13, 1965 — TOMOMI MURAKAMI — 3,195,062

AGC PARAMETRIC AMPLIFIER USING NEGATIVE BIAS AND DETUNED CIRCUITS

Filed Jan. 19, 1961 — 2 Sheets-Sheet 2

INVENTOR.
Tomomi Murakami
BY

Attorney

United States Patent Office 3,195,062

Patented July 13, 1965

3,195,062

AGC PARAMETRIC AMPLIFIER USING NEGATIVE BIAS AND DETUNED CIRCUITS

Tomomi Murakami, Haddonfield, N.J., assignor to Radio Corporation of America, a corporation of Delaware Filed Jan. 19, 1961, Ser. No. 83,809
3 Claims. (Cl. 330—4.9)

This invention relates to amplifiers of electrical signal wave energy, and more particularly to amplifiers of the type using a non-linear reactance device as the active circuit element thereof.

Amplifiers which make use of a non-linear reactance device to effect signal amplification are known as parametric or reactance amplifiers, and are discussed in Coupled Mode and Parametric Electronics, by William H. Louisell, John Wiley, 1960. In its simplest form, a parametric amplifier comprises a non-linear reactance device, a pump oscillator, and associated resonant circuits tuned respectively to the frequency of an input signal to be amplified, the pump oscillator signal, and an idler signal. The pump circuit need not be tuned if sufficient pump power is supplied.

The idler signal which has a frequency corresponding to one of the sidebands resulting from the interaction of the input signal to be amplified and pump signal in the non-linear reactance device is developed in the idler circuit and has an amplitude determined by the pump and input signal amplitudes. The idler signal reacts back on the non-linear reactance device and, in conjunction with the pump signal, generates a current in the device at the signal frequency. This current develops a voltage across the signal input circuit, and if the voltage produced is in phase with the initial input voltage which started process, energy is added and the circuit behaves as a regenerative amplifier.

The parametric amplifier is essentially a small signal device and ordinarily does not have the ability to handle large signals. For example in circuits using zero-biased variable capacitance diodes as the non-linear reactance element, input signal amplitudes above 5000 microvolts may tend to drive the diode into its forward conducting region. This action produces distortion and effective compression of the modulation components of an applied carrier wave signal. Furthermore, large amplitude signals which are translated through the parametric amplifier stage may tend to overload succeeding amplifier stages thereby causing further distortion as well as other undesirable effects.

A parametric amplifier in accordance with the invention includes a non-linear reactance device, such as a variable capacitance junction diode, and associated circuits tuned respectively to the input signal, pump signal, and idler signal frequencies. To reduce the gain of the amplifier and its susceptibility to distortion when strong signals are applied, a reverse bias voltage is applied to the variable capacitance diode. In a signal receiver, the reverse bias voltage may be derived from a received carrier wave in suitably designed automatic gain control (AGC) circuits.

The reverse bias on the diode has two effects. First, distortion is reduced because the diode operating point is moved further away from its forward conducting region so that larger signal voltage excursions may be tolerated without driving the diode into its forward conducting region. Second, the gain of the stage is reduced because the increased reverse bias on the diode changes its mean capacitance thereby causing the idler circuit to be detuned. The idler frequency currents are reduced so that there is less reaction by the idler signal on the diode thus resulting in less gain. The increased reverse bias also changes the operating point of the diode to a region where a smaller change in capacitance is exhibited for a given excursion of voltage. This results in correspondingly less gain in the circuit.

The novel features which are considered characteristic of this invention are set forth with particularity in the appended claims. The invention itself, however, both as to its organization and method of operation, as well as the additional objects and advantages thereof, will best be understood from the following description when read in connection with the accompanying drawings in which:

Figure 1:
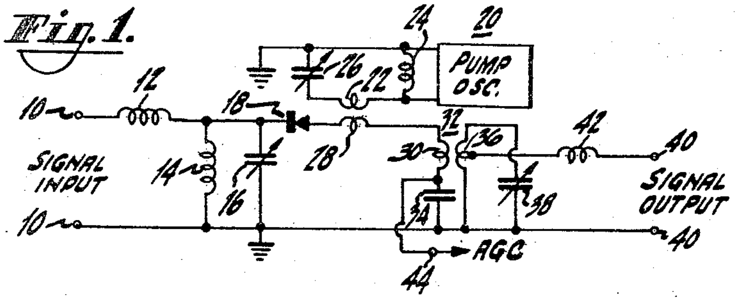
FIGURE 1 is a schematic circuit diagram of a parametric amplifier embodying the invention.

Referring to the drawings, like reference numerals will be used to indicate similar elements throughout. With specific reference to FIGURE 1, a signal to be amplified, such as a signal modulated carrier wave from an antenna or preceding amplifier, or other suitable source is applied to a pair of input terminals 10 one of which is at ground potential. A pair of inductors 12 and 14 and a variable capacitor 16 are connected to the input terminals 10. The inductor 12 and the effective capacitance of the inductor 14-capacitor 16 form a series circuit resonant at the input signal frequency. The signal input circuit is relatively broad band, and because of the small number of reactive components used, the insertion loss is low. The input signal appearing across the capacitor 16 is applied to a variable capacitance junction diode 18 which is connected in series with an inductor 28, the primary winding 30 of a coupling transformer 32 and a D.-C. blocking capacitor 34. The diode 18 comprises the non-linear reactance element of the amplifier.

A pump oscillator 20 is coupled to a circuit including a pair of inductors 22 and 24 which are tuned to the pump oscillator frequency by a variable capacitor 26. Energy from the pump oscillator is coupled from the inductor 22 to the inductor 28, and is mixed with the input signal in the diode 18 to produce sidebands or beat frequency signals.

One of the sideband signals, called the idler signal, which may for example comprise a signal having a frequency corresponding to the difference in frequency between the signal and pump frequencies, is developed across the primary winding 30 of the coupling transformer 32.

A double tuned network is provided for the idler signal. The primary portion of the circuit comprises a series circuit including the inductances of the inductor 28 and the primary winding 30 together with the capacitance of the diode 18 and the effective capacitance of the signal input circuits. These elements are relatively sharply tuned to the frequency of the idler signal. The secondary portion of the double tuned network includes the secondary winding 36 of the transformer 32 which is also tuned to the frequency of the idler signal by a variable capacitor 38. An amplified output signal at the idler frequency then appears at the output terminals 40 which are connected respectively to ground and to a tap on the secondary winding 36 through an inductor 42.

Parametric amplifiers of the type described are suitable for low noise amplification of small signals. However for larger signal levels such as above 5,000 microvolts across 50 ohms at the amplifier input terminals 10, the amplifier may overload and produce modulation distortion. The distortion is produced when the diode is driven by the signal into the forward conducting region of its operating characteristic. In addition the stronger signal is translated by the amplifier to produce an output voltage at the output terminals 40 which may be of a sufficient magnitude to overdrive succeeding signal translating stages connected thereto thereby producing further distortion as well as other undesirable results.

In accordance with the invention, a parametric amplifier of the type described in FIGURE 1 is adapted to handle strong input signals of the order of 0.5 to 1.0 volt in amplitude without distortion or overloading of succeeding amplifier stages by applying a controllable reverse bias to the diode 18 from a source, not shown, connected to the AGC terminal 44. A delayed AGC voltage source is provided so that for small signals, that is signals having amplitudes up to 5,000 microvolts, only a small substantially constant reverse bias from about 0.1 volt is applied to the diode 18. It was found that this small initial reverse bias improved the overall noise figure of the system.

Figures 2, 3, 8:
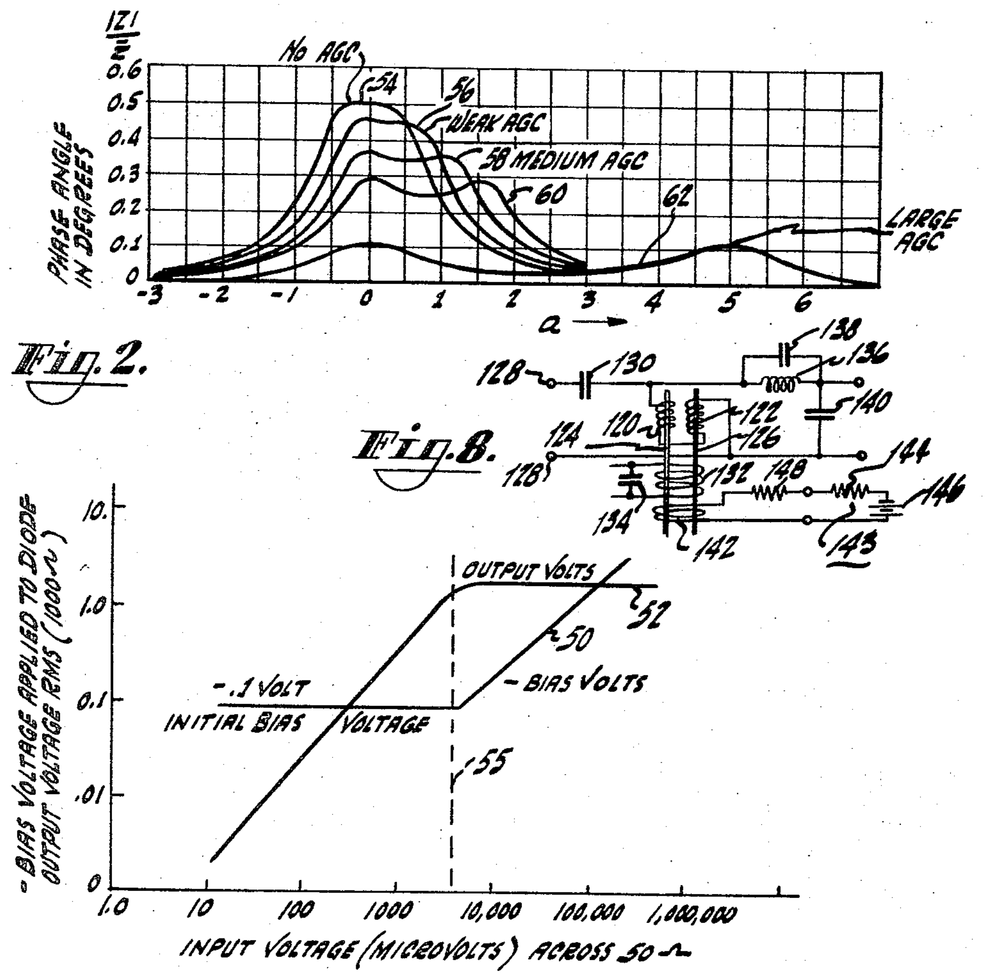
FIGURE 2 is a graph of the bandpass characteristics of the parametric amplifier idler circuit for varying amounts of AGC voltage.
FIGURE 3 is a graph of the output voltage with respect to input voltage characteristic of a gain controlled parametric amplifier embodying the invention.
FIGURE 8 is a schematic circuit diagram of a parametric amplifier embodying the invention, which uses a non-linear inductance.

For stronger signals, as is shown by the curve 50 of FIGURE 3, the reverse bias across the diode is increased with increasing values of applied signal voltage so that the level of the output signal remains substantially constant as is indicated by the curve 52 of FIGURE 3. For the purpose of deriving the curve 52, a down converter, intermediate frequency amplifier and second detector were connected to the output terminals 40. The curve of FIGURE 3 is a plot of the R.M.S. value of 1000 cycle modulation appearing at the second detector with varying levels of applied carrier signal modulated with a 1000 cycle signal at 50% modulation. The output was held substantially constant at a level corresponding to a carrier level of 3.0 volt R.M.S. at the second detector.

The mechanism by which the gain control is effected will now be discussed. The primary effect of the reverse bias voltage applied to the diode 18 is to cause the mean capacitance of the diode to shift to a lower value. This in turn causes a detuning of the primary portion of the idler circuit. The circuit is designed so that the variation of the capacitance of the diode 18 does not appreciably effect the tuning of the signal input and pump oscillator circuits. For example in the embodiment described in connection with FIGURE 1 the pump oscillator circuit is loosely coupled to the other circuits so that there is only a minimum amount of detuning due to the capacitance change, and the signal input circuit is so broadly tuned relative to the idler frequency that an incremental change in capacitance of the diode 18 has a much greater effect on the tuning of the idler circuit than on the tuning of the signal input circuit.

The bandpass characteristic of the double tuned idler circuit normalized with respect to frequency is shown in FIGURE 2. The curve 54 illustrates the bandpass characteristic with only the small initial AGC voltage applied to the diode for small signal operation. As the applied signal amplitudes are progressively increased past a threshold level indicated by the dotted line 55, of FIGURE 3, more and more reverse bias is applied across the diode causing greater and greater change in the detuning of the idler circuit. As the reverse bias is increased, the bandpass characteristic of the idler circuits positively degenerates as is shown respectively in the curves 56, 58, 60 and 62. The curve 62 represents a condition where the primary portion of the double tuned idler circuit is detuned 10%.

Since, as mentioned above, gain in the parametric amplifier is due in part to the reaction of the idler signal on the diode 18, there will be less gain as the AGC voltage is increased because there is less idler signal to react on the diode.

A secondary effect of gain reduction in the parametric amplifier due to the increased reverse bias applied to the diode 18 is because of the shift in the operating point of the diode to a point on its characteristic where a smaller change in capacitance results from a given voltage excursion. This means that for a given signal, there is a smaller change in the reactance of the diode 18, and correspondingly less gain.

The third effect resulting from increasing the diode reverse bias is that its operating point is shifted further away from its forward conducting region. This means that a larger signal voltage swing can be tolerated before the diode 18 is driven into its forward conducting region thereby reducing the danger of distortion which would result if the diode were not so reverse biased.

Figure 4:
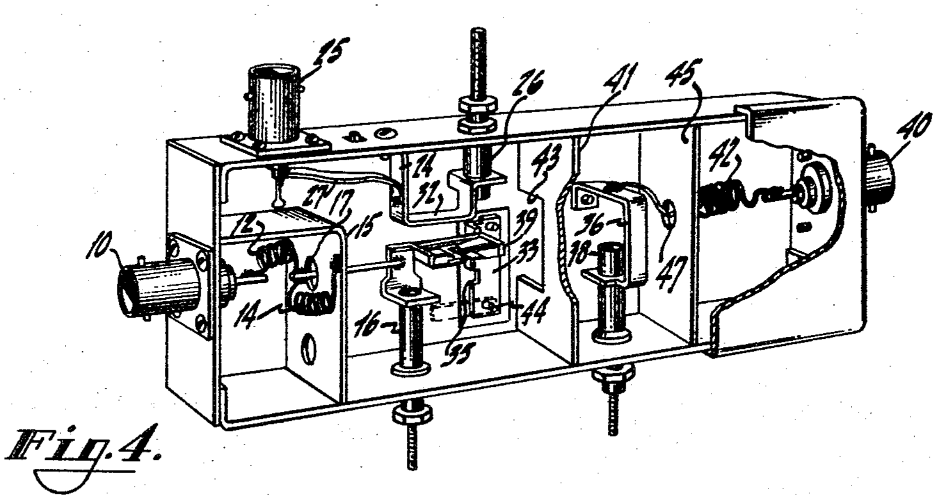
FIGURE 4 is a perspective view of a physical embodiment of the schematic circuit diagram shown in FIGURE 1.
Figure 5:
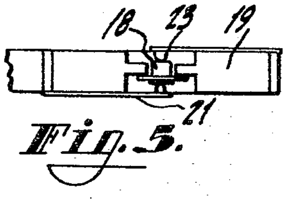
FIGURE 5 is an enlarged view of the parametric diode and its mount of FIGURE 4.
Figure 6:
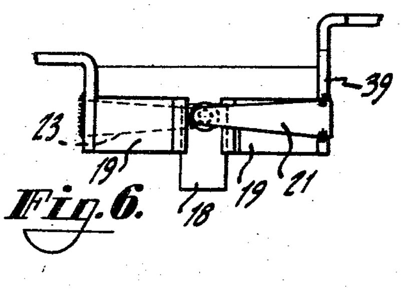
FIGURE 6 is a plan view of the parametric diode and its mount.

A physical exemplification of the parametric amplifier shown schematically in FIGURE 1 is shown in FIGURES 4, 5 and 6. Like reference numerals are applied to corresponding parts as an aid to tracing the circuit in the physical embodiment. The signal to be amplified is applied to the input terminals 10 which comprise a standard microwave fitting, and are coupled to the diode 16 through the self supporting tuning inductor 12. The tuning inductors 12 and 14 are enclosed in a shielded compartment including a conductive wall 15. A small aperture 17 is provided in the wall 15 through which the connection is made to the diode. The tuning capacitors 16, 26 and 28 are of conventional construction having a core of conductive material that is movable within a cylindrical insulating form with respect to a conductive coating on the external surface of the form.

The pump oscillator is connected through a standard microwave fitting 25 to the pump oscillator circuit which includes a strap of metal 32–24 connected between the fixed electrode of the capacitor 26 and the chassis wall. The pump oscillator is connected to this strap of metal through a conductor 27 extending between the fitting 25 and the point on the strap spaced slightly from its connection in the chassis wall. A portion of the strap between the fixed electrode of the capacitor and the junction with the conductor 27 corresponds to the inductor 22 and a portion of the strap from the junction thereof with the conductor 27 to the chassis wall corresponds to the inductor 24.

The diode 18 is mounted in a support 19 of insulating material which includes a pair of conductive contacts 21 and 23 which respectively engage opposite sides of the diodes. The oppositely disposed contacts 21 and 23 of the diode support 19 and a portion of a bracket 33 that holds the opposite side of the diode support correspond to the inductor 28. It is to be noted that the bracket 33 is spaced from the chassis bottom wall by a sheet of insulating material 35 such as mica or the like to form the D.-C. blocking capacitor 34. A screw 44 which is insulated from the chassis wall but is conductively connected to the bracket 33 provides the terminal through which a AGC voltage is applied to the diode 18. In the present example to reduce the gain of the amplifier, this AGC voltage will be made more negative.

An upstanding portion 39 of the bracket 33 corresponds to the primary winding 30 of the transformer 32. A shield wall 41 extending transversely across the chassis is provided to contain the various fields produced in the left side of chassis as shown in FIGURE 4. An aperture 43 is provided in the shield wall 41 to permit coupling of energy at the idler frequency to the secondary winding 36 which comprises a rectangular shaped strap of metal.

The shield wall 41 and a parallel shield wall 45 form a compartment for containing the idler frequency fields. A small aperture 47 is provided in the shield wall 45 through which a connection from the coupling transformer secondary winding 36 is made to the output terminal 40 of the amplifier through the self supporting inductor 42.

The amplifier described in connection with FIGURES 1 and 4–6 was successfully operated with input signals of 207 megacycles, and a pump frequency of 1062 megacycles and an idler frequency of 812 megacycles. The amplifier was operated with signal input voltages in excess of 100,000 microvolts without overload or distortion, and a substantially constant output voltage was maintained over a very wide range of input signal voltage levels.

Figure 7:
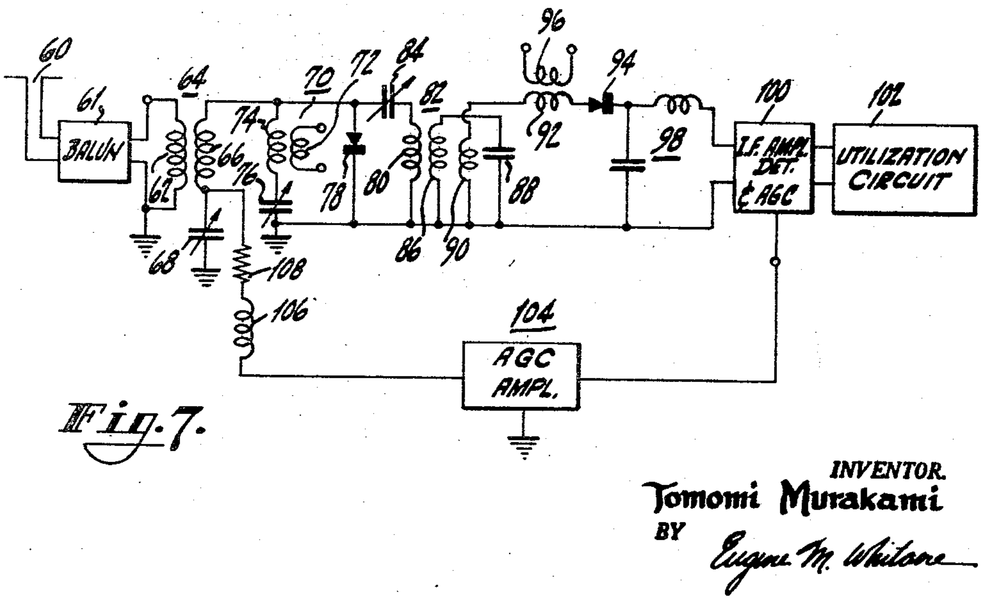
FIGURE 7 is a schematic circuit diagram of a signal receiver including a modification of a parametric amplifier shown in FIGURE 1 and embodying the invention.

FIGURE 7 is a schematic circuit diagram of a signal receiver including a modification of the parametric amplifier described heretofore. Signals from an antenna 60 are coupled through a balance-to-unbalance or balun network 61 to the primary winding 62 of an input transformer 64. The secondary winding 66 of the input transformer is tuned to the desired signal frequency by a variable capacitor 68.

A second coupling transformer 70 includes a primary winding 72 which is coupled to a pump oscillator, not shown. The secondary winding 74 of the transformer 70 is connected in series with a variable capacitor 76 which is adjusted so that this circuit is resonant at the pump oscillator frequency. The signal input and pump circuits are both connected in parallel with a variable capacitance diode 78 which comprises the non-linear reactance element for the up-converter amplifier. An up-converter amplifier is one in which the idler frequency is higher than the input signal frequency.

Idler frequency signals developed as a result of the interaction of the pump and input signals in the non-linear reactance of the diode 78 are developed across the primary winding 80 of a coupling transformer 82. The primary winding 80 is tuned to the idler frequency by a variable capacitor 84.

The transformer 82 includes a secondary winding 86 which is tuned to the idler frequency by a variable capacitor 88. The primary and secondary winding circuits form a double tuned network of the same general type as discussed in connection with FIGURE 1.

Amplified signal energy at the idler frequency is extracted by a tertiary winding 90 of the transformer 82, and coupled through an inductor 92 to a mixer diode 94. Energy from a local oscillator, not shown, is also coupled to the diode 94 by way of the mutual coupling between the inductor 92 and the inductor 96. The diode 94 comprises a portion of a conventional down converter circuit to reduce the idler frequency to the intermediate frequency of the receiver.

The resulting intermediate frequency signals are applied through a filter network 98 to an intermediate frequency amplifier and second detector 100. The detected signals are then applied to suitable utilization circuits 102 such as the sound, video and deflection circuits of a television receiver. The second detector circuit includes means for developing a control or AGC voltage as a function of the average level of the received signal. It will be recognized by those skilled in the art that other forms of AGC developing circuits may be used, such as, for example, keyed AGC circuits commonly used in television receivers.

The AGC voltage is applied to an AGC amplifier 104. If sufficient AGC power is available in the AGC developing circuits, the amplifier 104 may be eliminated. From the amplifier 104 the AGC voltage is applied through an R-F choke 106 and a series resistor 108 to the junction of the variable capacitor 68 and the secondary winding 66.

As in the case of the circuit of FIGURE 1, no AGC voltage or a nominal reverse bias voltage of constant value is applied from the AGC circuits across the diode for small signal amplification. For stronger input signals, i.e. above 5000 microvolts, the AGC voltage becomes more negative increasing the reverse bias on the diode 78. The increased reverse bias causes a shift in the mean capacitance of the diode thereby detuning the idler circuit and reducing the amplifier gain as described above. In addition, the diode operating point is moved further away from the forward conducting region thereby preventing the stronger signals from overloading the amplifier and causing distortion. The AGC system of the invention is effective to maintain the output voltage from the second detector substantially constant over a wide range of applied signal input voltages.

The principles described above are also applicable to parametric amplifiers which use ferrites or ferrite core coils as the non-linear reactance element. Such an amplifier is discussed in "Ferrite Cored Coils" by V. D. Landon, RCA Review, September 1949, p. 387. FIGURE 8 shows a parametric amplifier employing a non-linear inductance element comprised of the windings 120 and 122 respectively wound on the ferrite cores 124 and 126. A pump oscillator signal is applied to the input terminals 128, and the capacitor 130 and coils 120 and 122 are resonant at the pump oscillator frequency.

A signal to be amplified is applied to a coil 132 wound on the cores 124 and 126, and tuned to the signal frequency by a capacitor 134. A trap network comprising a parallel inductor 136 and capacitor 138 tuned to the pump oscillator frequency, keeps the pump signal out of the succeeding circuits.

The capacitors 130, 138 and 140 and the inductors 120, 122 and 136 are resonant at the difference frequency resulting from the non-linear interaction of the pump and signal frequencies in the coils 120 and 122. Gain is effected in the circuit of FIGURE 8 in substantially the same manner as discussed hereinabove.

To control the gain of the amplifier, a winding 142 is positioned on the cores 124 and 126. A control voltage source 143 shown as a variable resistor 144 and a battery 146 is connected to the winding 142 through an isolating resistor 148. The control voltage source may, if desired, comprise the AGC circuits of a signal receiver. As the current through the winding 142 is changed, the saturation of the cores 124 and 126 is also changed. This action changes the inductance of the coils 120 and 122, thereby affecting the tuning of the idler circuits. As the center frequency of the idler circuit passband departs from the idler signal frequency, the idler currents are reduced, thereby reducing the gain of the amplifier.

What is claimed is:

1. A parametric amplifier comprising the combination of a variable capacitance junction diode, a signal input circuit coupled to said diode, a pump oscillator coupled to said diode, an idler circuit tuned to the difference frequency produced by the interaction of signals from said signal input circuit and said pump oscillator, said idler circuit coupled to said diode, and means including a gain controlling voltage source for applying a relatively fixed amount of reverse bias voltage to said diode for signals applied to said input circuit below a predetermined threshold level and increasing values of reverse bias voltage to said diode for increasing levels above said threshold level of signals applied to said input circuit.

2. A parametric amplifier comprising the combination of a signal input circuit including a first inductor connected in series with a parallel combination of a second inductor and a first variable capacitor, said variable capacitor adjusted to tune said input circuit to the frequency of an applied signal to be amplified, a non-linear variable capacitance junction diode connected in series with a third and a fourth inductor across said first variable capacitor, a pump oscillator circuit including a fifth inductor coupled to said third inductor to apply energy at the frequency of said pump oscillator to said diode, the inductance of said third and fourth inductors and the capacitance of said diode and first variable capacitor selected to resonate at a frequency corresponding to the difference in frequency between the signals from said signal input circuit and said pump oscillator, a sixth inductor coupled to said fourth inductor for receiving energy at the frequency of said sideband, said sixth inductor tuned to the frequency of said sideband by a second variable capacitor connected therewith, means for coupling energy from said sixth inductor to an output terminal for said amplifier, means providing a gain controlling bias voltage source connected to apply increasing values of reverse bias voltage to said diode for increasing levels of signals applied to said input circuit, an increase in said reverse bias voltage being effective to change the mean capacitance of said diode.

3. A parametric amplifier comprising the combination of a non-linear variable capacitance junction diode, a signal input circuit having a frequency response range which is wider than the frequency range of the sidebands of a signal modulated wave to be amplified coupled to said diode, means providing a pump oscillator coupled to said diode, a double tuned idler circuit tuned to the difference frequency produced by the interaction of signals from said signal input circuit and said pump oscillator, at least a portion of said double tuned idler circuit being connected to said diode, means including a gain controlling voltage source connected to apply a relatively fixed amount of reverse bias voltage to said diode for signals applied to said input circuit below a predetermined threshold level and increasing values of reverse bias to said diode for increasing levels above said threshold level of signals applied to said input circuit, said increasing values of reverse bias voltage effective to change the means capacitance of said diode and also effective to move the operating point of said diode further away from the forward conducting region of the diode characteristic.

References Cited by the Examiner

UNITED STATES PATENTS

| | | | |
|---|---|---|---|
| 2,719,223 | 9/55 | Van der Ziel et al. | 330—5 |
| 3,067,394 | 12/62 | Zimmerman et al. | 307—88.5 |
| 3,093,802 | 6/63 | Chow | 330—145 |
| 3,118,113 | 1/64 | Ferrar et al. | 330—4.5 |
| 3,121,844 | 2/64 | Glomb | 330—4.5 |

FOREIGN PATENTS

| | | |
|---|---|---|
| 1,081,515 | 5/60 | Germany. |
| 1,087,646 | 8/60 | Germany. |

OTHER REFERENCES

Chow et al.: "IRE Transactions on Broadcast and Television Receivers," April 1955, pages 1–15.

Jones: "CQ," March 1960, pages 34–36 and 125.

Knechtli et al.: "Proceedings of the IRE," July 1960, pages 1218–1226.

Lowry: "Radio & TV News," May 1957, pages 55–58.

Seidel et al.: "1959 WESCON Convention Record Part 2," pages 83–90, August 1959.

"Electronic and Radio Engineering:" by Terman, McGraw-Hill, New York, 1955, pages 946–949.

Vodicka et al., "Electronics," Aug. 26, 1960, pages 56–60.

ROY LAKE, *Primary Examiner.*

BENNETT G. MILLER, *Examiner.*